(12) United States Patent
Li et al.

(10) Patent No.: US 9,113,565 B2
(45) Date of Patent: Aug. 18, 2015

(54) METHOD FOR PROCESSING PRINTED CIRCUIT BOARD, PRINTED CIRCUIT BOARD AND ELECTRONIC APPARATUS

(75) Inventors: Chuanzhi Li, Shenzhen (CN); Hua Miao, Shenzhen (CN); Zhanhao Xie, Shenzhen (CN); Jun Peng, Shenzhen (CN)

(73) Assignee: Shennan Circuits Co., Ltd, Shenzhen, Guangdong (CN)

( * ) Notice: Subject to any disclaimer, the term of this patent is extended or adjusted under 35 U.S.C. 154(b) by 0 days.

(21) Appl. No.: 14/000,566

(22) PCT Filed: Jun. 19, 2012

(86) PCT No.: PCT/CN2012/077153
§ 371 (c)(1),
(2), (4) Date: Feb. 27, 2015

(87) PCT Pub. No.: WO2013/189029
PCT Pub. Date: Dec. 27, 2013

(65) Prior Publication Data
US 2015/0163909 A1    Jun. 11, 2015

(51) Int. Cl.
*H05K 1/11* (2006.01)
*H05K 1/02* (2006.01)
*H05K 3/00* (2006.01)

(52) U.S. Cl.
CPC .............. *H05K 1/115* (2013.01); *H05K 1/0298* (2013.01); *H05K 3/0094* (2013.01); *H05K 2201/09509* (2013.01)

(58) Field of Classification Search
CPC .......... H05K 3/429; H05K 2201/0723; H05K 2201/0715; H05K 1/0218; H05K 3/4652
USPC .................. 174/266, 250; 29/852
See application file for complete search history.

(56) References Cited

U.S. PATENT DOCUMENTS

| | | | |
|---|---|---|---|
| 7,705,246 B1 * | 4/2010 | Pritchard et al. | 174/262 |
| 2005/0243527 A1 * | 11/2005 | Jandzio et al. | 361/760 |
| 2007/0029106 A1 * | 2/2007 | Kato | 174/255 |
| 2007/0159753 A1 * | 7/2007 | Randall et al. | 361/111 |
| 2010/0282502 A1 * | 11/2010 | Kato | 174/260 |
| 2012/0153493 A1 * | 6/2012 | Lee et al. | 257/774 |

FOREIGN PATENT DOCUMENTS

| CN | 1768559 A | 5/2006 |
|---|---|---|
| CN | 202759661 U | 2/2013 |

OTHER PUBLICATIONS

Written Opinion of International Searching Authority (with English translation) dated Mar. 28, 2013; 11 pp.

* cited by examiner

*Primary Examiner* — Timothy Thompson
*Assistant Examiner* — Rhadames J Alonzo Miller
(74) *Attorney, Agent, or Firm* — Ohlandt, Greeley, Ruggiero & Perle, LLP

(57) ABSTRACT

A printed circuit board (PCB), a method for processing PCB and an electronic apparatus. The method for processing PCB may comprise: forming a hole in the PCB, wherein the PCB includes a metal matrix and at least two substrate layers, at least one of the at least two substrate layers has a geoelectric layer thereon; and the metal matrix is fixed in a slot provided in the substrate, the formed hole contacts both the geoelectric layer and the metal matrix; and providing conductive substances in the hole, with the conductive substances in the hole being in contact with the inner geoelectric layer and the metal matrix, so that the geoelectric layer and the metal matrix are in conduction with each other.

20 Claims, 12 Drawing Sheets

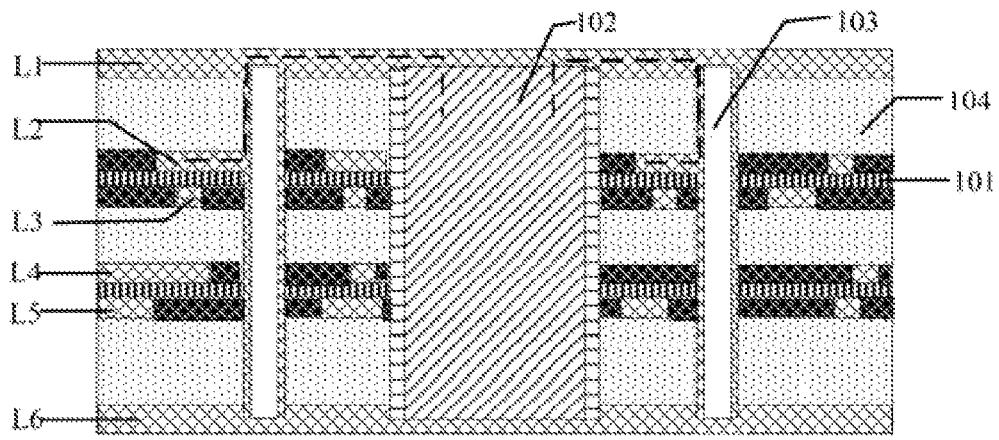
Fig. 1
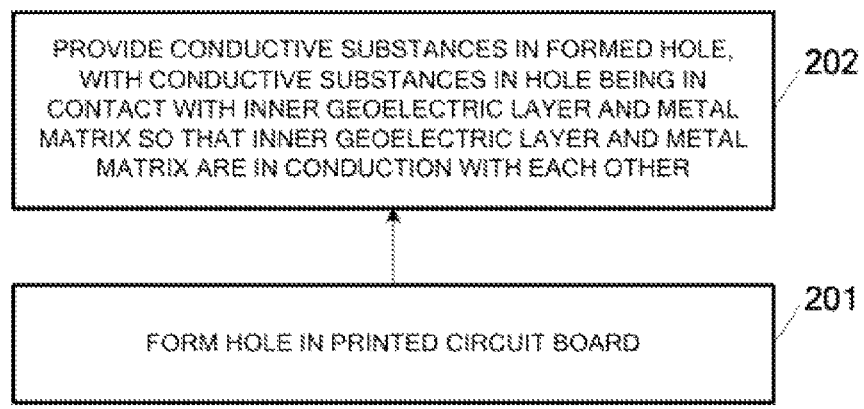
Fig. 2-a
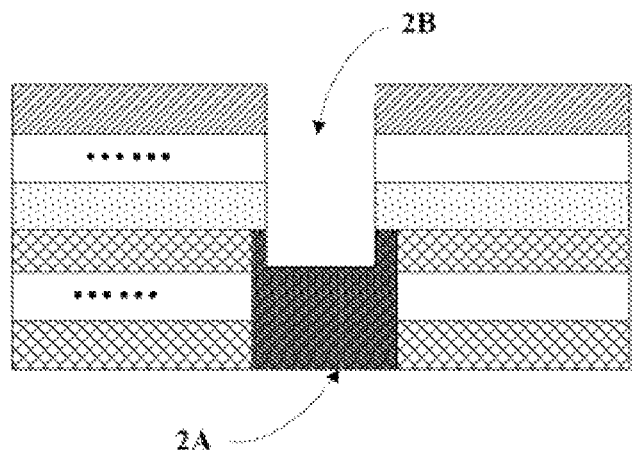
Fig. 2-b

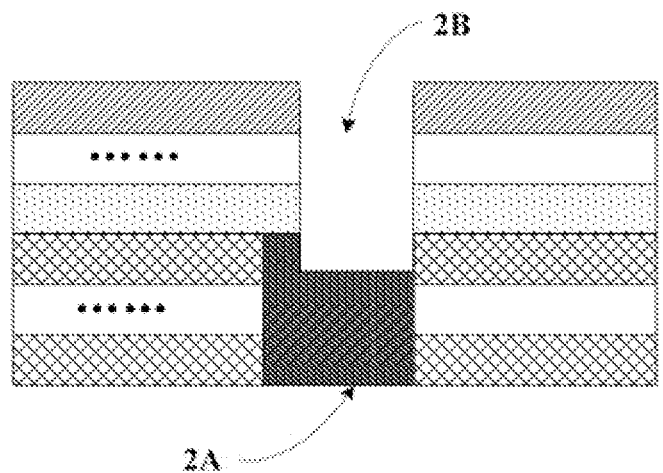
Fig. 2-c
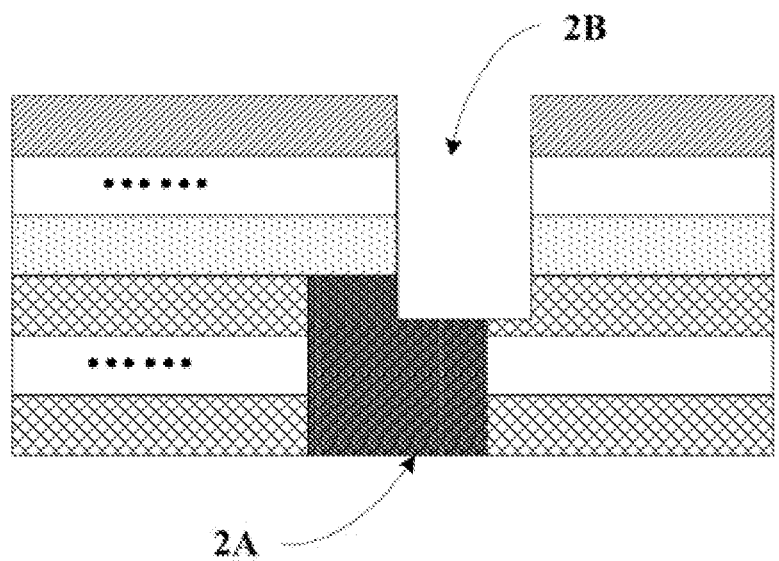
Fig. 2-d

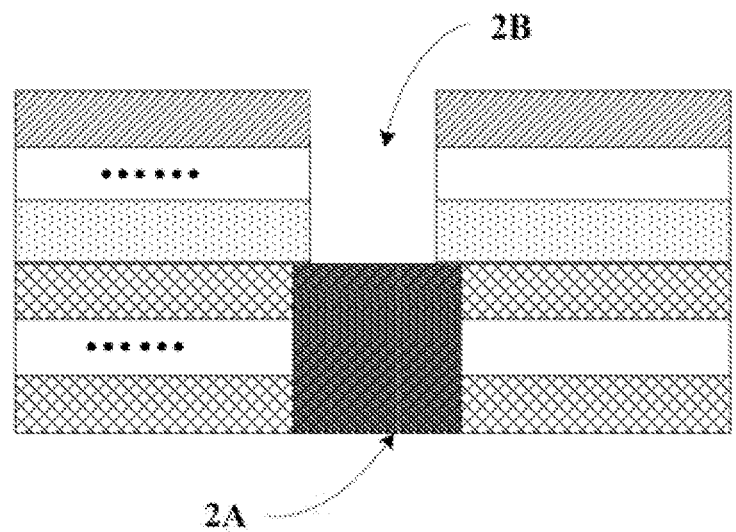
Fig. 2-e
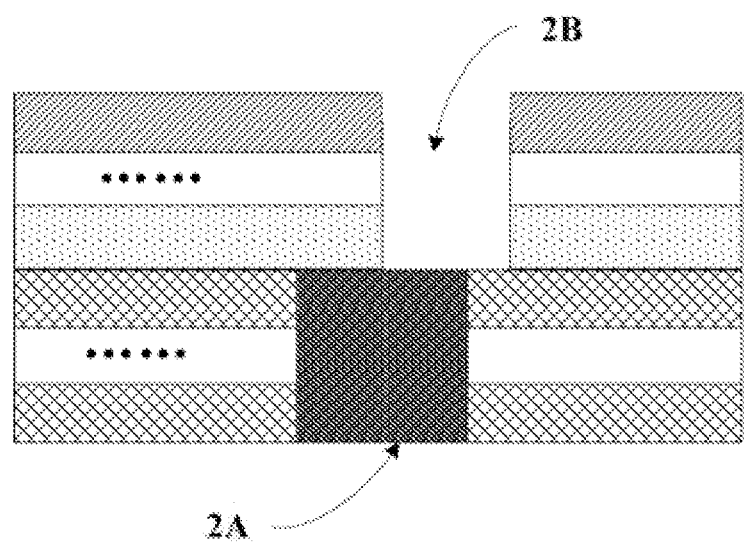
Fig. 2-f

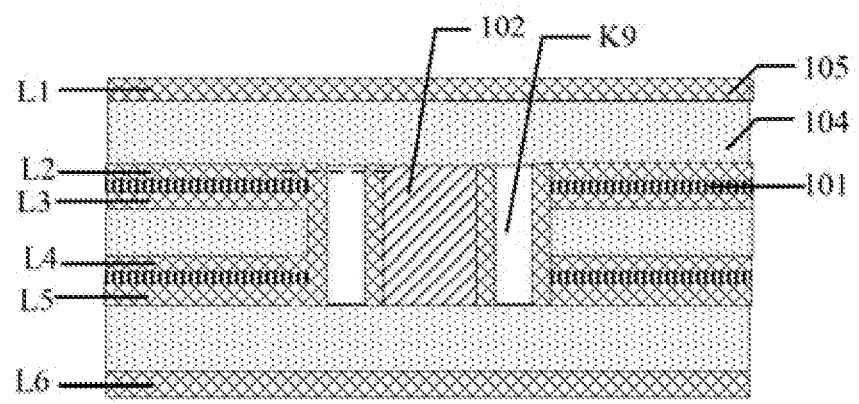
Fig. 13
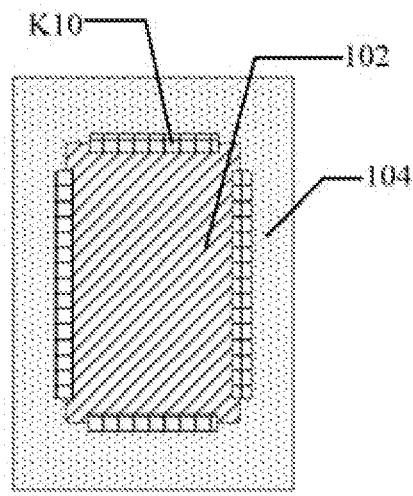
Fig. 14-a
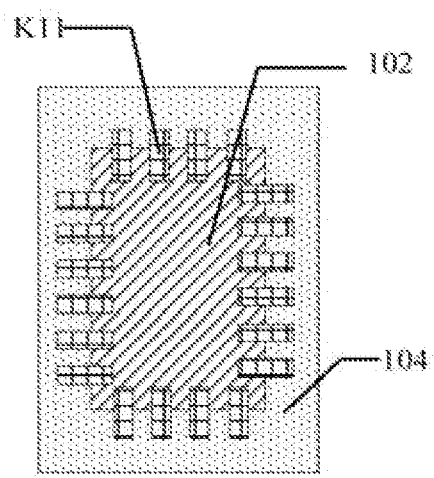
Fig. 14-b

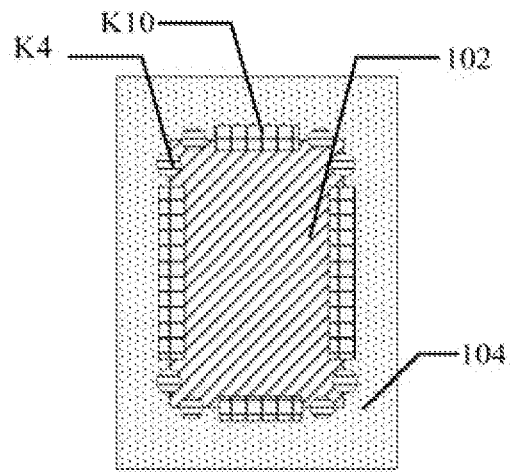
Fig. 15-a
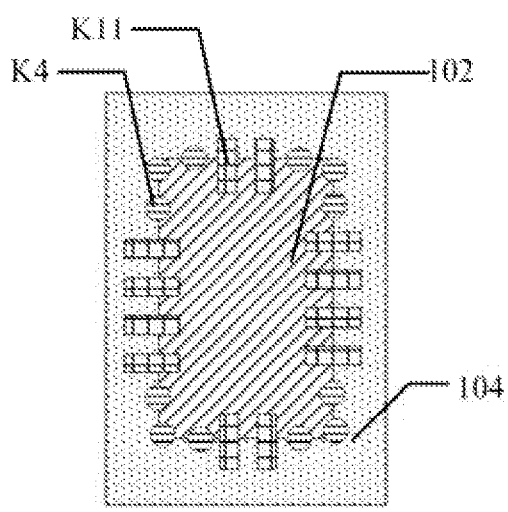
Fig. 15-b

METHOD FOR PROCESSING PRINTED CIRCUIT BOARD, PRINTED CIRCUIT BOARD AND ELECTRONIC APPARATUS

FIELD OF THE INVENTION

The application relates to the field of manufacturing the printed circuit board, and in particular to a method for processing a printed circuit board, a printed circuit board and an electronic apparatus.

BACKGROUND OF THE INVENTION

Presently, there are a variety of printed circuit boards (PCB), which are widely used. In a high-frequency and high-speed PCB, metal matrix embedded in the PCB is grounded mainly by conducting with an inner geoelectric layer.

In the prior art, the metal matrix is in conduction with the inner geoelectric layer via wires. In practice, it is found that, although the existing connecting way enables the geoelectric layer to be connected to the metal matrix, this connecting way has poor reliability, often resulting in broken circuit, and has unstable transmission performance for a high frequency signal.

SUMMARY OF THE INVENTION

There are provided a method for processing PCB, a PCB and an electronic apparatus in embodiments of the application, which may improve reliability of connection between geoelectric layer and a metal matrix of the PCB and improve transmission performance of a high frequency signal.

There is provided a method for processing PCB in the embodiments of the invention, including:
  forming a hole in a printed circuit board, wherein the printed circuit board includes a metal matrix and at least two substrate layers, at least one of the at least two substrate layers has an inner geoelectric layer thereon, and the metal matrix is fixed in a slot provided in the substrate; and
  providing conductive substances in the hole, with the conductive substances in the hole being in contact with the inner geoelectric layer and the metal matrix, so that the inner geoelectric layer and the metal matrix are in conduction with each other.

Optionally, the metal matrix is full-buried or half-buried in the printed circuit board, and the method further includes:
  providing, in the printed circuit board, a blind slot for installing a component, wherein the bottom surface of the blind slot is located partially or wholly on the metal matrix.

Optionally, the blind slot is concaved partially in the metal matrix.

Optionally, the method further includes: metallizing the blind slot.

Optionally, forming a hole in a printed circuit board includes: removing part of the edge of the substrate and/or part of the edge of the metal matrix to form a hole; or,
  in the case where the substrate is bonded with the metal matrix by adhesive, forming a hole in as printed circuit board includes: removing part of the adhesive between the substrate and the metal matrix to form a hole; removing part of the edge of the substrate and part of the adhesive between the substrate and the metal matrix to form a hole; or removing part of the edge of the metal matrix and part of the adhesive between the metal matrix and the substrate to form a hole; or, removing part or the adhesive between the metal matrix and the substrate and removing part of the edge of the metal matrix and part of the edge of the substrate to form a hole.

Optionally, the adhesive is prepreg, conductive adhesive, resin or Polyethylene terephthalate plastic.

Optionally, the substrate is further provided thereon with second wiring layers being non-geoelectric layers, wherein part or all of the second wiring layers on the substrate contact with the conductive substances in the hole, so as to be in conduction with the metal matrix via the conductive substances in the hole.

Optionally, part of the second wiring layers contacting with a wall of the hole contact with the conductive substances in the hole, so as to be in conduction with the metal matrix via the conductive substances in the hole.

Optionally, forming a hole in a printed circuit board includes:
  forming a hole in the printed circuit board by laser; or
  forming a hole in the primed circuit board by a mechanical drill; or
  forming a hole in the printed circuit board by plasma etching; or
  forming a hole in the printed circuit board by chemical etching.

Optionally, providing conductive substances in the hole includes: metallizing the wall of the hole; or filling the hole with conductive medium; or welding a wire in the hole.

Optionally, the hole is a blind hole or a through hole or a buried hole, wherein an axis of the hole intersects with or as substantially perpendicular to the geoelectric layer.

There is further provided a printed circuit board in the embodiments of the invention. The printed circuit board includes a metal matrix and at least two substrate layers, wherein
  at least one of the at least two substrate layers has an inner geoelectric layer thereon, the metal matrix is fixed in a slot provided in the substrate, a hole is further formed in the printed circuit board, and conductive substances in the hole are in contact with the inner geoelectric layer and the metal matrix, so that the inner geoelectric layer and the metal matrix are in conduction with each other.

Optionally the metal matrix is full-buried or half-buried in the primed circuit board;
  a blind slot for installing a component is provided in the printed circuit board, wherein the bottom surface of the blind slot is located partially or wholly on the metal matrix.

Optionally, the blind slot is concaved partially in the metal matrix.

Optionally, the blind slot is a metallized blind slot.

Optionally, the substrate is further provided thereon with second wiring layers being non-geoelectric layers, wherein part or all of the second wiring layers on the substrate contact with the conductive substances in the hole, so as to be in conduction with the metal matrix via the conductive substances in the hole.

Optionally, part of the second wiring layers contacting with the wall of the hole contact with the conductive substances in the hole, so as to be in conduction with the metal matrix via the conductive substances in the hole.

Optionally, the hole is a blind hole or a through hole or a buried hole, wherein an axis of the hole intersects with or is substantially perpendicular to the geoelectric layer.

Optionally, the metal matrix is a columnar metal matrix or a stepped metal matrix.

There is also provided an electronic apparatus in embodiments of the invention. The electronic apparatus includes a component and a printed circuit board;
    wherein the printed circuit board includes: a metal matrix and at least two substrate layers:
    wherein at least one of the at least two substrate layers has an inner geoelectric layer thereon, the metal matrix is fixed in a slot provided in the substrate, a hole is further formed in the printed circuit board, and conductive substances in the hole are in contact with the inner geoelectric layer and the metal matrix, so that the inner geoelectric layer and the metal matrix are in conduction with each other.
    Optionally, a blind slot for installing a component is provided in the printed circuit board, wherein
        the bottom surface of the blind slot is located partially or wholly on the metal matrix, wherein the component is installed in the blind slot.
    Optionally, the blind slot is concaved partially in the metal matrix.
    Optionally, the blind slot is a metallized blind slot.
    Optionally, the substrate is further provided thereon with second wiring layers being non-geoelectric layers, wherein part or all of the second wiring layers on the substrate contact with the conductive substances in the hole, so as to be in conduction with the metal matrix via the conductive substances in the hole.
    Optionally, the hole is a blind hole or a through hole or a buried hole, wherein an axis of the hole intersects with or is substantially perpendicular to the geoelectric layer.
    Optionally, the metal matrix is a columnar metal matrix or a stepped metal matrix.
    Optionally, the metal matrix is full-buried or half-buried in the printed circuit board.
    Optionally, the substrate is bonded with the metal matrix by adhesive.
    Optionally, the adhesive is prepreg, conductive adhesive, resin or polyethylene terephthalate plastic.

It can he known from above that, in the embodiments of the invention, since one or more conductive holes are formed between the metal matrix in the PCB and the geoelectric layer on the substrate, with the conductive substances in the conductive hole contacting with both the inner geoelectric layer and the metal matrix of the PCB, the inner geoelectric layer can be in direct interconnection and conduction with the metal matrix via the conductive substances in the hole, so that the grounding performance of the metal matrix is more reliable and it is beneficial to improve the performance of heat dissipation. Furthermore, since the loop length between the inner geoelectric layer and the metal matrix reduced, it is beneficial to reduce generation of secondary inductance and parasitic capacitance, thus being beneficial to reduce the influence of the secondary inductance and the parasitic capacitance on transmission of a signal, and being beneficial to improve transmission performance of a high frequency signal, and further being beneficial to improve the miniaturization and integration level of the PCB. Furthermore, the conductive hole formed around the metal matrix can have a signal shielding function for the component fixed on the metal matrix, thus being beneficial to further improve the performance of products.

Furthermore, a blind slot for installing a component can also be provided in the PCB, with the bottom surface of the blind slot being located partially or wholly on the metal matrix. The blind slot can be metallized by electroplating, surface coating and so on. After the blind slot is metallized, the component can be installed in the metallized blind slot. Metallization of the blind slot is beneficial in welding and heat dissipation of the component. The metal matrix or the component installed in the blind slot can be in conduction with the inner geoelectric layer or other wiring layers via the conductive substances on the side wall of the blind slot, and thus become the ground terminal of the component. The component can also be in conduction with the inner geoelectric layer or other wiring layers via the conductive substances on the side wall of the blind slot. In this way, some inner geoelectric layers can also be in direct interconnection and thus conduction with the metal matrix via the conductive substances on the side wall of the blind slot, the grounding performance of the metal matrix and the component is more reliable, thus being beneficial to improve the performance of heat dissipation. Furthermore, since the loop length between the inner geoelectric layer (and/or other wiring layers) and the metal matrix can be reduced, or the grounding loop length between the component and the inner geoelectric layer (and/or other wiring Layers) can be reduced, it is beneficial to reduce the generation of the secondary inductance and the parasitic capacitance, thus being beneficial to reduce the influence of the secondary inductance and the parasitic capacitance on transmission of a signal, and being beneficial to improve transmission performance of a high frequency signal, and further being beneficial to improve the miniaturization and integration level of the PCB.

BRIEF DESCRIPTION OF THE DRAWINGS

In order to illustrate technical solutions in embodiments of the application or in the prior art more clearly, drawings to be used in the description of the embodiments or the prior art are introduced briefly hereinafter. Obviously, the drawings described below relate to only some embodiments of the invention, and other drawings may be obtained based on these drawings by those skilled in the art without any creative work.

FIG. 1 is a structural schematic diagram of a printed circuit board (PCB) according to an embodiment of the application;

FIG. 2-*a* is a flow schematic diagram of a method for processing PCB according to an embodiment of the application;

FIG. 2-*b* is a schematic diagram of a slot formed in a PCB according to an embodiment of the application;

FIG. 2-*c* is a schematic diagram of another slot formed in a PCB according to an embodiment of the application;

FIG. 2-*d* is a schematic diagram of a further slot formed in a PCB according to an embodiment of the application;

FIG. 2-*e* is a schematic diagram of still another slot formed in a PCB according to an embodiment of the application;

FIG. 2-*f* is a schematic diagram of a still further slot formed in a PCB according to an embodiment of the application;

FIG. 13 is a structural schematic diagram of still another PCB according to an embodiment of the application;

FIG. 14-a is a PCB, which is provided with an across-boundary slot, according to an embodiment of the application;

FIG. 14-b is another PCB, which is provided with an across-boundary slot, according to an embodiment Of the application;

FIG. 15-a is a PCB, which is provided with an across-boundary slot and an across-boundary hole, according to an embodiment of the application;

FIG. 15-b is another PCB, which is provided with an across-boundary slot and an across-boundary hole, according to an embodiment of the application;

DETAILED DESCRIPTION OF THE INVENTION

Figure 3:
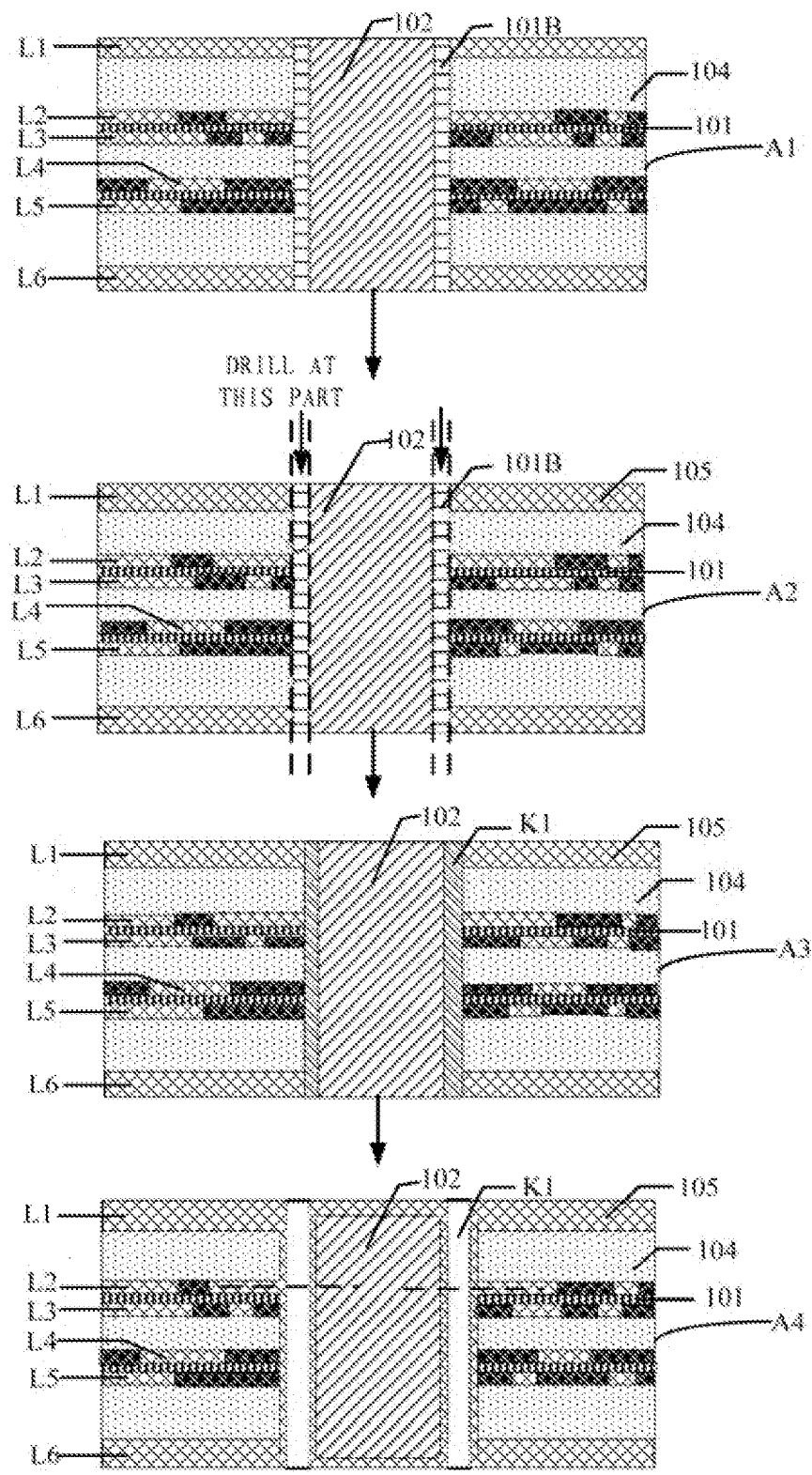
FIG. 3 is a flow schematic diagram of processing PCB according to an embodiment of the application.

There are provided in the embodiments of the application a method for processing a printed circuit board (PCB), a PCB and an electronic apparatus, which are intended to improve reliability of connection between an inner geoelectric layer and a metal matrix of the PCB and improve transmission performance of a high frequency signal.

In order to make those skilled in the art better understand the solutions of the application, the technical solutions in the embodiments of the application will be described clearly and completely hereinafter in conjunction with the accompanying drawings in the embodiments of the application. Obviously, the described embodiments are only a part of, not all of embodiments of the application. All other embodiments, which are obtained by those skilled in the an based on the embodiments in the application without any creative work, should fall within the scope of protection of the application.

Firstly referring to FIG. 1. it shows, by way of example, one way by which an inner-layer line (for example, a geoelectric layer) is conducted with a metal matrix in the PCB. Specifically, the PCB shown in FIG. 1 has 3 substrate layers totally, with each substrate layer having 2 wiring layers thereon, and thus 6 wiring layers L1, L2, L3, L4, L5 and L6 in total. The substrate layers are bonded with each other by using prepreg 101 as adhesive. Due to the insulation function of the prepreg 101, the inner wiring layers L2, L3, L4 and L5 cannot be connected with the metal matrix 102. One way is to drill a through holt 103 outside the metal matrix of the laminated PCB, to metalize the through hole 103 such that the wiring layers are interconnected and to electroplate the external wiring layers L1 and L6 such that the external wiring layers are directly connected with the metal matrix 102, thereby enabling the inner wiring layers (such as a geoelectric layer) to be indirectly connected with the metal matrix 102 via the through bole 103, referring to the conducting line shown by the dotted line in FIG. 1. In practice, it is found that, although this way enables the line on the inner-layer substrate (such as a geoelectric layer) to be connected with the metal matrix, signal integrity and transmission performance of a high frequency signal may be influenced, and even the high frequency signal may disappear finally, because the geoelectric loop (as shown by the dotted line with respect to the layer L2 in FIG. 1) is long and there are inductive holes (secondary inductance generated from via-holes) and capacitive pads (parasitic capacitance generated from inner-layer pads) in the loop.

In the following other solutions are discussed continuously.

An embodiment of the method for processing PCB according to the application may include: forming a hole in the PCB, wherein the PCB includes a metal matrix and at least two substrate layers, at least one of the at least two substrate layers has an inner geoelectric layer thereon, and the metal matrix is fixed in a slot provided in the substrate; and providing conductive substances in the hole, with the conductive substances in the hole being in contact with the inner geoelectric layer and the metal matrix, so that the inner geoelectric layer and the metal matrix are in conduction with each other.

Referring to FIG. 2-a, method for processing PCB according to an embodiment of the application includes the following steps.

In step 201, (one or more) holes are formed in a PCB.

Specifically, the PCB may include a metal matrix and at least two substrate layers, At least one of at least two substrate layers has an inner geoelectric layer (the geoelectric layer is a wiring layer for grounding, and thus the inner geoelectric layer is an inner wiring layer of the PCB) thereon. The metal matrix is fixed in a slot provided in the substrate. It should be understood that, the formed hole described above may be a cylindrical hole, a prismatic hole (e.g., a triangular prism hole, a quadrangular prism hole, hexagonal prism hole, or the like) or an irregular columnar hole (i.e. having a cross section in an irregular shape). The non-cylindrical hole can also be referred to as a slot-hole or a slot. The metal matrix in the PCB is, for example, a columnar metal matrix or a stepped metal matrix or a metal matrix with any other shape. The metal matrix can be buried wholly in the PCB, or can extend through the PCB, or can be half-buried in the PCB.

In some embodiments of the application, the hole formed in the PCB may be, for example, a blind hole or a through hole or a buried hole, wherein the cross section of the hole is, for example, substantially in parallel with the geoelectric layer, and an axis of the hole is, for example, substantially perpendicular to or intersects with the geoelectric layer. Of course, the axis of the hole may not be a straight line, i.e., the hole may extend along a curved path.

In step 202, conductive substances may be disposed in the formed hole, with the conductive substances in the hole being in contact with the inner geoelectric layer and the metal matrix, so that the inner geoelectric layer and the metal matrix are in conduction with each other.

In some embodiments of the application, the substrate in the PCB can be bonded with the metal matrix, for example, by adhesive, and the substrate layers can also be bonded with each other by adhesive. One or both sides of each substrate layer can be provided with a wiring layer. The wiring layer can be classified as a geoelectric layer or a non-geoelectric layer (for ease of description, the wiring layer being a non-geoelectric layer can be referred to as "second wiring layer" below). The adhesive may be, for example, prepreg, conductive adhesive, resin, polyethylene terephthalate plastic or other adhesives. In some embodiments of the application, for example, a second wiring layer(s) may be also provided on the substrate in the PCB. The conductive substances in the hole formed in the PCB can also contact with part or all of the second wiring layers on the substrate, such that the part or all of the second wiring layers is in conduction with the metal matrix via the conductive substances in the hole.

Specifically, the substrate may be formed of common material, or may be formed of low frequency material, medium frequency material or high frequency material, or a combination thereof.

In some embodiments of the application, the conductive substances in the hole formed in the PCB can be, for example, in point-contact, line-contact or surface-contact with the geoelectric layer (and/or the second wiring layer), and can be in point-contact, line-contact or surface-contact with the metal matrix. The geoelectric layer in contact with the conductive substances in the hole described above may be an inner wiring layer and/or an external wiring layer of the PCB.

It should be understood that, the so-called point-contact may mean that the area of the contacting part is below a certain value (e.g. 0.1 square millimeter or other values) and both the length and the width of the contacting part are below a certain value (e.g. 1 millimeter); the so-called line-contact may mean that the width of the contacting part is below a certain value and the length of the contacting part is above a certain value; and the so-called surface-contact may mean that the area of the contacting part is above a certain value (e.g. which is a value less than 0.1 square millimeter or other values), and both the length and the width of the contacting part are above a certain value. Therefore, the point-contact, the line-contact and the surface-contact are in a relative sense. Depending on different references, the point-contact may become the surface-contact, or the surface-contact may become the point-contact.

In some embodiments of the application, in the case where the substrate in the PCB is bonded with the metal matrix by the adhesive, forming a hole in the PCB may include, for example, removing part of the adhesive between the substrate and the metal matrix to form a hole; or removing part of edge of the substrate and part of the adhesive between the substrate and the metal matrix to form a hole; or removing part of edge of the metal matrix and part of the adhesive between the metal matrix and the substrate to form a hole; or removing part of the adhesive between the metal matrix and the substrate and removing part of the edge of the metal matrix and part of the edge of the substrate to form a hole.

In some other embodiments of the application, for example, the metal matrix may be directly fixed in a slot provided in the substrate. For example, the metal matrix can be frozen firstly (freezing makes the volume of the metal matrix become smaller); then the frozen metal matrix may be placed in the slot provided in the substrate; and once the temperature of the metal matrix rises and thus the volume of the metal matrix becomes larger, the metal matrix can be fixed in the slot. Alternatively, the metal matrix can be forcibly pressed into the slot provided in the substrate. In this case the forming a hole in the PCB may include: removing part of the edge of the substrate described above and/or part of the edge of the metal matrix described above to form a hole.

In some embodiments of the application, for example, a hole can be formed in the PCB by using laser or a mechanical drill, or in a plasma etching manner or a chemical etching manner. Of course, the hole can be formed in the PCB by any combination of at least two ways described above or other ways, which is not limited herein.

In some embodiments of the application, conductive substances can be provided in the formed hole described above in various ways. For example, the wall of the formed hole can be metalized; or the hole can be filled with conducting medium; or a wire can be welded in the hole. Of course, the conductive substances can be provided in the formed hole described above by any combination of at least two ways described above or other ways so that the hole is conductive, which is not limited herein.

In some embodiments of the application, among the second wiring layers contacting with the wall of the hole, part of the second wiring layers contacts with the conductive substances in the hole, so as to be in conduction with the metal matrix via the conductive substances in the hole. In this way, part of the second wiring layers can be selectively in conduction with the metal matrix via the conductive hole, which is beneficial to meet the requirements in many situations.

In some embodiments of the application, in the case where the metal matrix is full-buried or half-buried in the PCB, a blind slot for installing a component can be provided in the PCB, and the bottom surface of the blind slot is located partially or wholly on the metal matrix. In this way, the component (e.g., a power device) installed in the blind slot can also dissipate heat or be grounded via the metal matrix. In some embodiments of the application, the blind slot for installing the component can be partially concaved in the metal matrix (i.e., part of the metal matrix is removed during formation of the blind slot). Of course, the blind slot for installing the component may not be concaved in the metal matrix (i.e., no part of the metal matrix is removed during formation of the blind slot).

Referring to FIGS. 2-*b* to 2-*f*, several forms in which a blind slot for installing a component is formed in the PCB with a half-buried metal matrix are exemplarily shown. In FIG. 2-*b*, the bottom surface of the formed blind slot 2B is entirely located on the metal matrix 2A, and is surrounded by the metal matrix 2A. That is, part of the blind slot 2B is concaved in the metal matrix 2A (i.e. part of the metal matrix 2A is removed during formation of the blind slot 2B). In FIG. 2-*c*, the bottom surface of the formed blind slot 2B is entirely located on the metal matrix 2A, not beyond the metal matrix 2A, and part of the blind slot 2B is concaved in the metal matrix 2A (i.e., part of the metal matrix 2A is removed during formation of the blind slot 2B). In FIG. 2-*d*, the bottom surface of the formed blind slot 2B is located partially on the metal matrix 2A, and the blind slot 28 is concaved partially in the metal matrix 2A (part of the metal matrix 2A is removed during formation of the blind slot 2B). In FIG. 2-*e*, the bottom surface of the formed blind slot 2B is located wholly on the metal matrix 2A, not beyond the metal matrix 2A, but the blind slot 2B is not concaved in the metal matrix 2A (i.e. no part of the metal matrix 2A is removed during formation of the blind slot 2B). In FIG. 2-*f*, the bottom surface of the formed blind slot 2B is located partially on the metal matrix 2A, and the blind slot 2B is not concaved in the metal matrix 2A (i.e. no part of the metal matrix 2A is removed during formation of the blind slot 2B). It should be understood that, in practical applications, a blind slot for installing the component, which is of any other structure, can be further formed in the PCB., which will not he exemplarily described herein.

In some embodiments of the application, the blind slot for installing a component described above can be further metallized. For example, the blind slot may be metallized by electroplating, surface coating and so on. After the blind slot is metallized, the component (for example, PA, a power amplifier component or other components) can be installed in the metallized blind slot. Metallization of the blind slot is beneficial in welding and heat dissipation of the component. The metal matrix or the component installed in the blind slot can be in conduction with the inner geoelectric layer or other wiring layers via the conductive substances on the side wall of the blind slot, and thus become the ground terminal of the component. The component can also be in conduction with the inner geoelectric layer or other wiring layers via the conductive substances on the side wall of the blind slot. In this way, some inner geoelectric layers can also be in direct interconnection and thus conduction with the metal matrix via the conductive substances on the side wall of the blind slot, the grounding performance of the metal matrix and the component is more reliable, thus being beneficial to improve the performance of heat dissipation. Furthermore, since the loop length between the inner geoelectric layer (and/or other wiring layers) and the metal matrix can be reduced, or the grounding loop length between the component and the inner geoelectric layer (and/or other wiring layers) can be reduced, it is beneficial to reduce the generation of the secondary inductance and the parasitic capacitance, thus being beneficial to reduce the influence of the secondary inductance and the parasitic capacitance on transmission of a signal, and being beneficial to improve transmission performance of a high frequency signal, and further being beneficial to improve the miniaturization and integration level of the PCB.

It can be seen from above that, in the embodiment, since one or more conductive holes are formed between the metal matrix in the PCB and the geoelectric layer on the substrate, with the conductive substances in the conductive hole contacting with both the inner geoelectric layer and the mend matrix of the PCB, the inner geoelectric layer can be in direct interconnection and conduction with the metal matrix via the conductive substances in the hole, so that the grounding performance of the metal matrix is more reliable and it is beneficial to improve the performance of heat dissipation. Furthermore, since the loop length between the inner geoelectric layer and the metal matrix is reduced, it is beneficial to reduce generation of secondary inductance and parasitic capacitance, thus being beneficial to reduce the influence of the secondary inductance and the parasitic capacitance on transmission of a signal, and being beneficial to improve transmission performance of a high frequency signal, and further being beneficial to improve the miniaturization and integration level of the PCB. Furthermore, the conductive hole formed around the metal matrix can have a signal shielding function for the component fixed on the metal matrix, thus being beneficial to further improve the performance of products.

In order to better understand and implement the above-described solutions of the embodiments of the application, the implementation is exemplarily illustrated hereinafter with reference to the accompanying drawings.

Referring to FIG. 3, a PCB including 3 substrate layers is exemplarily shown.

Specifically, each substrate layer has thereon wiring layers L1 and L2, L3 and L4, or L5 and L6. Specifically, layer L2 is an inner geoelectric layer for grounding, and a substrate 104 is provided between the wiring layers, and a metal matrix 102 is embedded in the substrates. Specifically, prepreg 101 is provided between the inner wiring layers L2 and L3, and between the inner wiring layers L4 and L5, and flowing resin 101B of the prepreg is provided between each of the wiring layers and the metal matrix 102.

Specifically, after the metal matrix 102 and the substrate are bonded together and before a conductive hole is formed, since the flowing resin 101B of the prepreg separates each of the wiring layers from the metal matrix 102, each of the wiring layers is not in interconnection and conduction with the metal matrix 102. It should be noted that, in FIG. 2, the metal matrix 102 passes through the substrate of the PCB, i.e., both the upper side and the lower side of the metal matrix 102 is exposed outside of the substrate. Of course, in other situations, the metal matrix can be half-buried in the substrate, i.e., only one side of the metal matrix is exposed to the outside and the rest parts are enwrapped in the substrate of the PCB. Alternatively, the metal matrix can be buried wholly in the PCB, i.e., the metal matrix is completely enwrapped in the PCB, with no part being exposed to the outside.

In the processing (A1-A2-A3-A4) shown in FIG. 3, a hole K1 is formed by removing the flowing resin 101B of part of the prepreg between the substrate and the metal matrix 102. By providing conductive substances in the hole K1 (for example, performing metallization to the wall of the hole K1), such that the inner geoelectric layer L1 of the substrate is in direct interconnection and conduction with the metal matrix 102 via the conductive substances in the hole K1, as indicated by the conducting line in the dotted line in FIG. 3. Providing conductive substances in the hole K1 may be implemented by: performing metallization processing (such as electroplating) to the wall of the hole K1 such that the hole K1 is conductive (in an example of FIG. 3, the metallization processing is made to the wall of the hole K1); or filling the hole K1 with conductive substances such that the hole K1 is conductive, or welding wires in the hole K1 such that the hole K1 is conductive. The conductive substances in the hole K1 contacts with both the metal matrix 102 and the geoelectric layer L2 of the substrate, such that the metal matrix 102 is in conduction with the geoelectric layer L2 of the substrate via the conductive substances in the hole K1. The conductive substances in the hole K1 may be in line-contact with the metal matrix 102 and may also be in line-contact with the geoelectric layer L2. In FIG. 3, the conductive substances in the hole K1 contact with other wiring layers addition to the geoelectric layer, such that the other wiring layers are in direct interconnection and conduction with the metal matrix 102 via the conductive substances in the hole K1.

It can be seen from above that, since the conductive, substances in the hole K1 contact with both the geoelectric layer L2 and the metal matrix 102, the inner geoelectric layer L2 is in conduction with the metal matrix 102 via the conductive substances in the hole K1, without the need of wiring on the external layer, thereby reducing the loop length between the inner geoelectric layer L2 and the metal matrix 102. This is beneficial to reduce the generation of the secondary inductance and the parasitic capacitance, and beneficial to reduce the influence of the secondary inductance and the parasitic capacitance on transmission of a signal, and beneficial to improve the transmission performance of a high frequency signal. The metal matrix 102 connects with the grounding terminal more sufficiently, Meanwhile, some of the layers L1, L3, L4, L5 and L6 can be de-metalized, for example, by circuit design, thereby enabling the conduction between the metal matrix 102 and the wiring layers which are not de-metallized.

Figure 4:
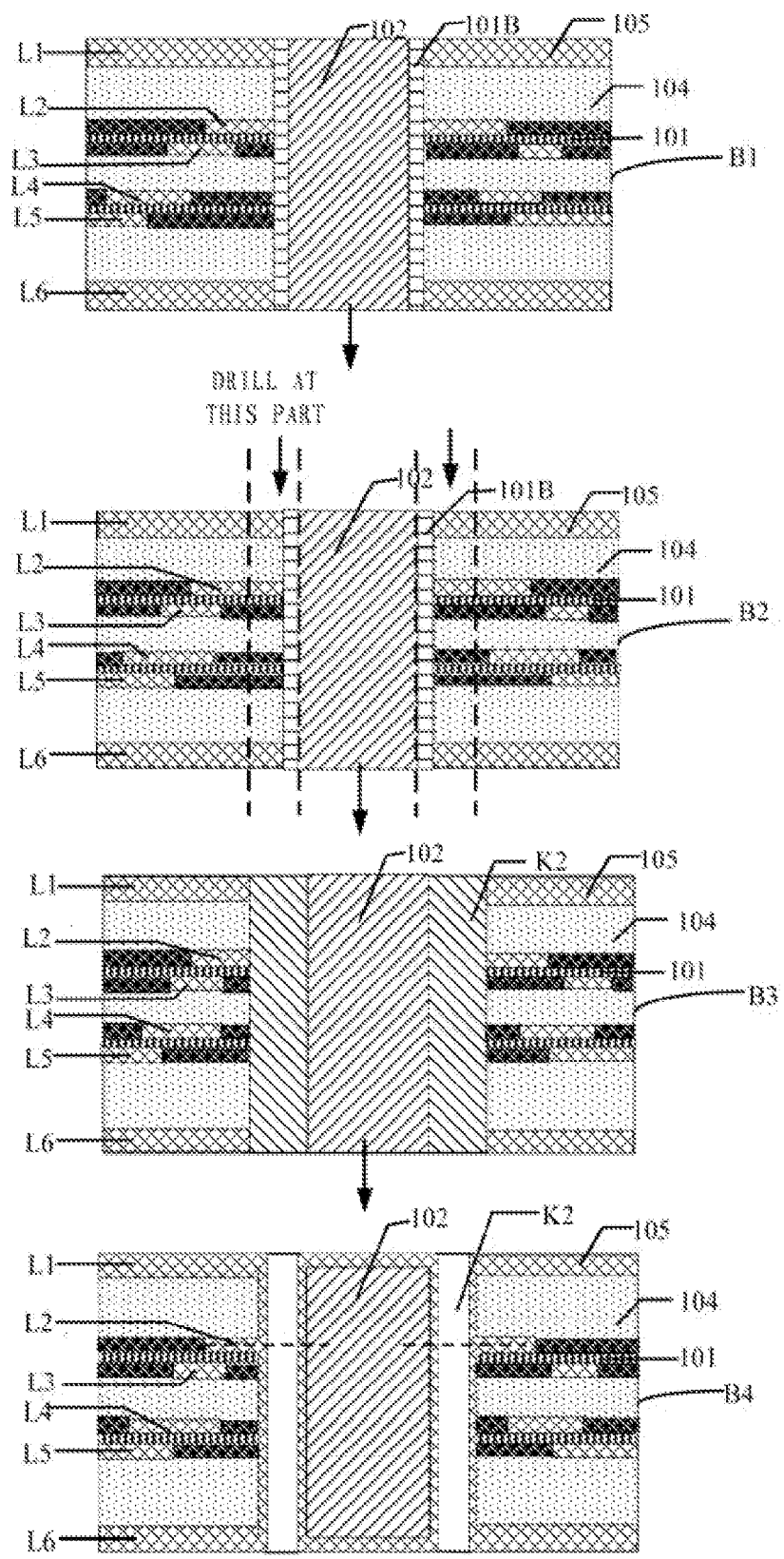
FIG. 4 is a now schematic diagram of another method for processing PCB according to an embodiment of the application.

Referring to FIG. 4, a PCB including 3 substrate layers is also exemplarily shown.

The processing (B1-B2-B3-B4) shown in FIG. 4 is different from the processing in the example of FIG. 3 mainly in that: a hole K2 is formed by removing the flowing resin 101B of part of the prepreg between the substrate and the meal matrix 102 and removing part of the edge of the substrate; and conductive substances are provided in the hole K2 (for example, performing metallization to the wall of the hole K2), such that the inner geoelectric layer L1 is in direct interconnection and conduction with the metal matrix 102 via the conductive substances in the hole K2. The conductive substances in the hole K2 may be in line-contact with the metal matrix 102, and may be in surface-contact with the geoelectric layer L2 and the substrate. It should be understood that due to the larger contact area, the surface-contact may have better and more reliable conducting performance. In FIG. 4, the conductive substances in the hole K2 also contact with other wiring layers in addition to the geoelectric layer, such that the other wiring layers are in direct interconnection and conduction with the metal matrix 102 via the conductive substances in the hole K2.

Figure 5:
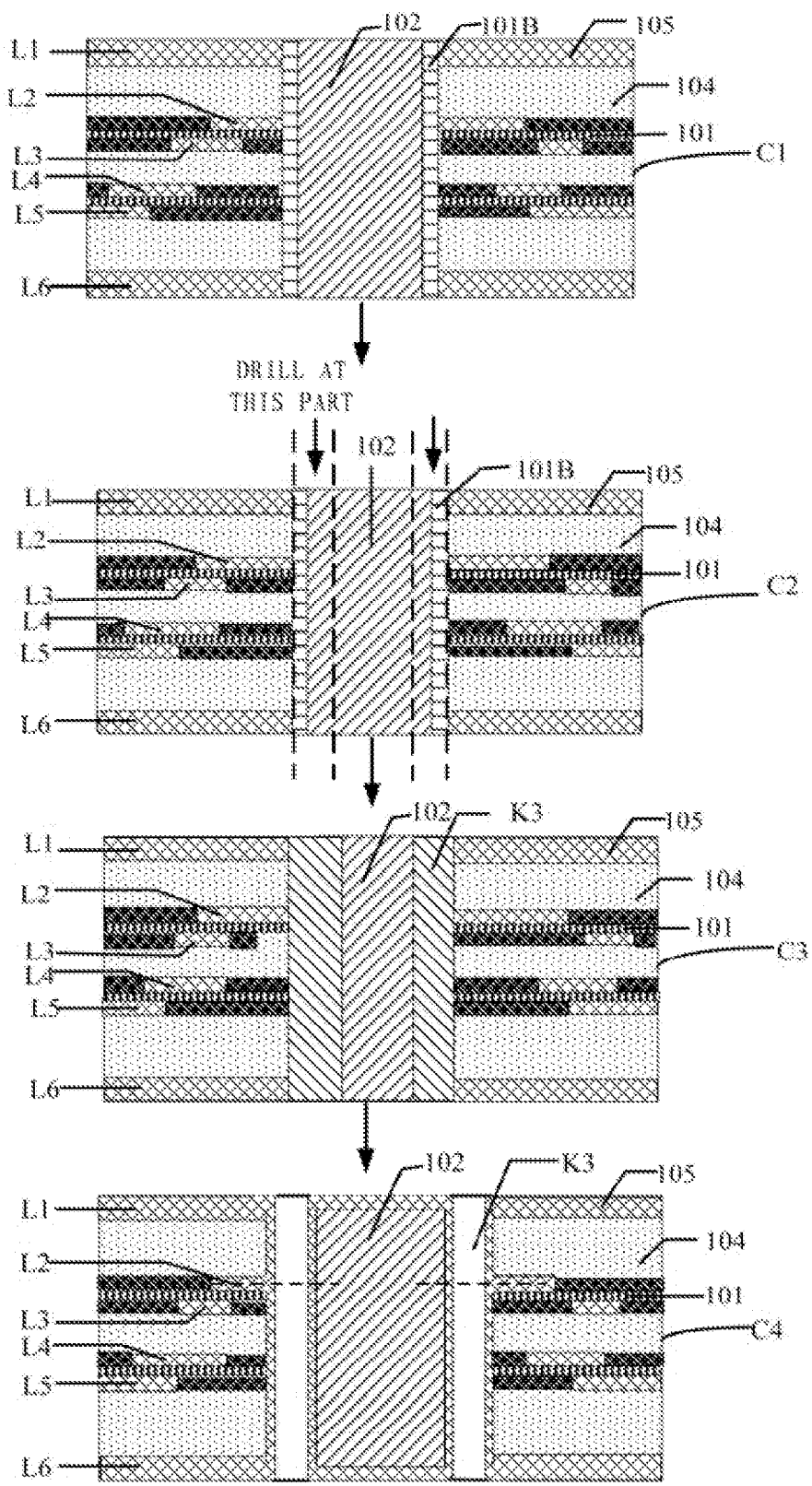
FIG. 5 is a flow schematic diagram of a further method for processing PCB according to an embodiment of the application.

Referring to FIG. 5, a PCB including 3 substrate layers is also exemplarily shown.

The processing (C1-C2-C3-C4) shown in FIG. 5 is different from the processing in the example of FIG. 3 mainly in that, a hole K3 is formed by removing the flowing resin 101B of part of the prepreg between the substrate and the metal matrix 102 and removing part of the edge of the metal matrix 102; and conductive substances are provided in the hole K3 (for example performing metallization to the wall of the hole K3), such that the inner geoelectric layer L1 is in direct interconnection and conduction with the metal matrix 102 via the conductive substances in the hole K3. The conductive substances in the hole K3 may be in surface-contact with the metal matrix 102, and may be in line-contact with the geoelectric layer L2 and the substrate. It should be understood that, due to the larger contact area, the surface-contact may have better and more reliable conducting performance. In FIG. 5, the hole K3 also contacts with other wiring layers in addition to the geoelectric layer, such that the other wiring layers are in direct interconnection and conduction with the metal matrix 102 via the conductive substances in the hole K3.

Figure 6:
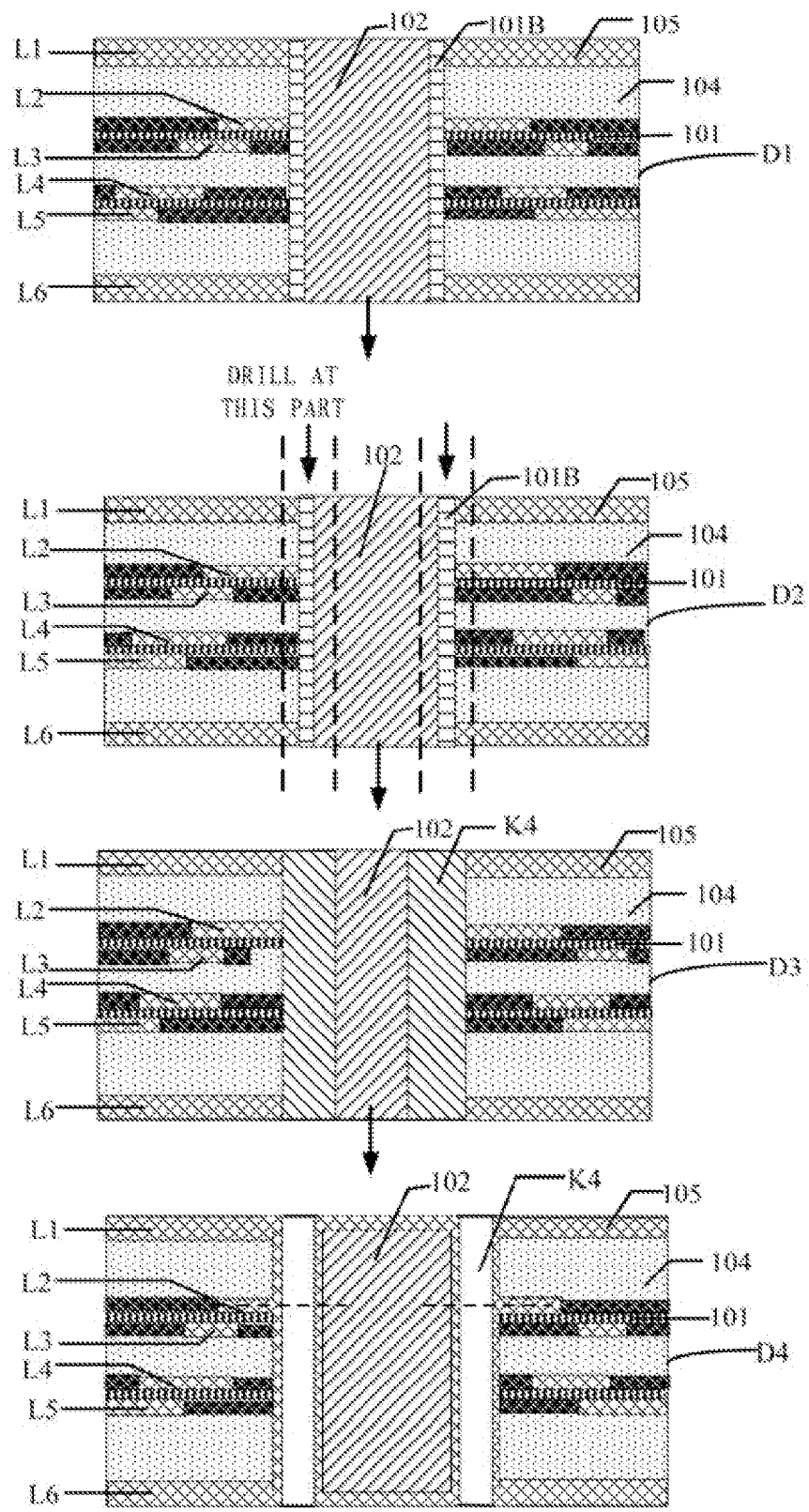
FIG. 6 is a flow schematic diagram of still another method for processing PCB according to an embodiment of the application.

Referring to FIG. 6, a PCB including 3 substrate layers is also exemplarily shown.

The processing (D1-D2-D3-D4) shown in FIG. 6 is different from the processing in the example of FIG. 3 mainly in that, a hole K4 is formed by removing the flowing resin 101B of part of the prepreg between the substrate and the metal matrix 102, removing part of the edge of the metal matrix 102, and removing pan of the edge of the substrate; and conductive substances are provided in the hole K4 (for example performing metallization to the wall of the hole K4), such that the inner geoelectric layer L1 is in direct interconnection and conduction with the metal matrix 102 via the conductive substances in the hole K4. The conductive substances in the hole K4 may be in surface-contact with the metal matrix 102, and may be in line-contact with the geoelectric layer L2 and the substrate. It should be understood that, due to the larger contact area, the surface-contact may have better and more reliable conducting performance. In FIG. 6, the hole K4 contacts with other wiring layers in addition to the geoelectric layer L2, such that the other wiring layers are in direct interconnection and conduction with the metal matrix 102 via the conductive substances in the hole K4.

It should be noted that, although the above figures exemplarily shows the processing of the PCB with a specific structure, forming a conductive hole in a PCB with any other structure to achieve the conduction between the wiring layer (for example, the geoelectric layer) and the metal matrix via the conductive hole may be implemented in the similar way.

There is provided a printed circuit hoard (PCB) in the embodiments of the application.

The printed circuit board may include a metal matrix and at least two substrate layers, wherein at least one of the at least two substrate layers has an inner geoelectric layer thereon, the metal matrix is fixed in a slot provided in the substrate; a hole is formed in the printed circuit hoard, conductive substances in the hole contact with both the inner geoelectric layer and the metal matrix, so that the inner geoelectric layer and the metal matrix are in conduction with each other.

In some embodiments of the application, the hole described above can be a cylindrical hole, a prismatic hole (e.g. a triangular prism hole, a quadrangular prism hole, a hexagonal prism hole, or the like) or an irregular columnar hole having a cross section in an irregular shape). The non-cylindrical hole can also be referred to as a slot-hole or a slot. The above metal matrix in the PCB is, for example, as columnar metal matrix or a stepped metal matrix or a metal matrix any other shape. The metal matrix can be buried wholly in the PCB, or can extend through the PCB, or can be half-buried in the PCB.

In some embodiments of the application, the hole formed in the PCB may be, for example, a blind hole or a through hole or a buried hole, wherein the cross section of the hole is, for example, substantially in parallel with the geoelectric layer, and an axis of the hole is, for example, substantially perpendicular to or intersects with the geoelectric layer. Of course, the axis of the hole may not be a straight line, i.e., the hole may extend along a curved path.

In some embodiments of the application, the substrate in the PCB can be bonded with the metal matrix, for example, by adhesive, and the substrate layers can also be bonded with each other by adhesive. Both sides of each substrate layer can be provided with a wiring layer. The wiring layer can be classified as a geoelectric layer or a non-geoelectric layer (for ease of description, the wiring layer being a non-geoelectric layer can he referred to as "second wiring layer" below). The adhesive may be, for example, prepreg, conductive adhesive, resin, polyethylene terephthalate plastic or other adhesives. In some embodiments of the application, for example, a second wiring layer(s) may be also provided on the substrate in the PCB. The conductive substances in the above hole can also contact with part or all of the second wiring layers on the substrate.

In some other embodiments of the application, for example, the metal matrix may be directly fixed in a slot provided in the substrate. For example, the metal matrix can be frozen firstly (freezing makes the volume of the metal matrix become smaller); then the frozen metal matrix may be placed in the slot provided in the substrate; and once the temperature of the metal matrix rises and thus the volume of the metal matrix becomes larger, the metal matrix can be fixed in the slot. Alternatively, the metal matrix can be forcibly pressed into the slot provided in the substrate. In this case, the above hole may be footed by removing part of the edge of the substrate described above and/or part of the edge of the metal matrix described above.

In some embodiments of the application, the conductive substances in the above hole in the PCB can be, for example, in point-contact, line-contact or surface-contact with the inner geoelectric layer (and/or the second wiring layer), and can be in point-contact, line-contact or surface-contact with the metal matrix. The geoelectric layer in contact with the conductive substances in the hole described above may further include an external wiring layer of the PCB.

In some embodiments of the application, the metal matrix can be full-buried or half-buried in or pass through the PCB described above, and a blind slot for installing a component can be provided in the PCB. The bottom surface of the blind slot is located partially or wholly on the metal matrix. In this way, the component (e.g., a power device) installed in the blind slot can also dissipate heat or be grounded via the metal matrix. In some embodiments of the application, the blind slot for installing the component can be partially concaved in the metal matrix (i.e., part of the metal matrix is removed during formation of the blind slot). Of course, the blind slot for installing the component may not be concaved in the metal matrix (i.e., no part of the metal matrix is removed during formation of the blind slot).

In some embodiments of the application, the above blind slot for installing a component may be metallized, for example, by electroplating, surface coating and so on. After the blind slot is metallized, the component (for example, PA, a power amplifier component or other components) can be installed in the metallized blind slot. Metallization of the blind slot is beneficial in welding and heat dissipation of the component. The metal matrix or the component installed in the blind slot can be in conduction with the inner geoelectric layer or other wiring layer via the conductive substances on the side wall of the blind slot, and thus become the ground terminal of the component. The component can also be in conduction with the inner geoelectric layer or other wiring layers via the conductive substances on the side wall of the blind slot. In this way, some inner geoelectric layers can also be in direct interconnection and thus conduction with the metal matrix via the conductive substances on the side wall of the blind slot, the grounding performance of the metal matrix and the component is more reliable, thus being beneficial to improve the performance of heat dissipation. Furthermore, since the loop length between the inner geoelectric layer (and/or other wiring layers) and the metal matrix can be reduced, or the grounding loop length between the component and the inner geoelectric layer (and/or other wiring layers) can be reduced, it is beneficial to reduce the generation of the secondary inductance and the parasitic capacitance, thus being beneficial to reduce the influence of the secondary inductance and the parasitic capacitance on transmission of a signal, and being, beneficial to improve transmission performance of a high frequency signal, and further being beneficial to improve the miniaturization and integration level of the PCB.

It can be seen from above that, in the embodiment, since one or more conductive holes are formed between the metal matrix in the PCB and the geoelectric layer on the substrate, with the conductive substances in the conductive hole contacting with both the inner geoelectric layer and the metal matrix of the PCB, the inner geoelectric layer can be in direct interconnection and conduction with the metal matrix via the conductive substances in the hole, so that the grounding performance of the metal matrix is more reliable and it is beneficial to improve the performance of heat dissipation. Furthermore, since the loop length between the inner geoelectric layer and the metal matrix is reduced, it is beneficial to reduce generation of secondary inductance and parasitic capacitance, thus being beneficial to reduce the influence of the secondary inductance and the parasitic capacitance on transmission of a signal, and being beneficial to improve transmission performance of a high frequency signal, and further being beneficial to improve the miniaturization and integration level of the PCB. Furthermore, the conductive hole formed around the metal matrix can have a signal shielding function for the component fixed on the metal matrix, thus being beneficial to further improve the performance of products.

In the following, the structure of the PCB according to the embodiment of the application will be exemplarily introduced with reference to the accompanying drawings.

Figure 7:
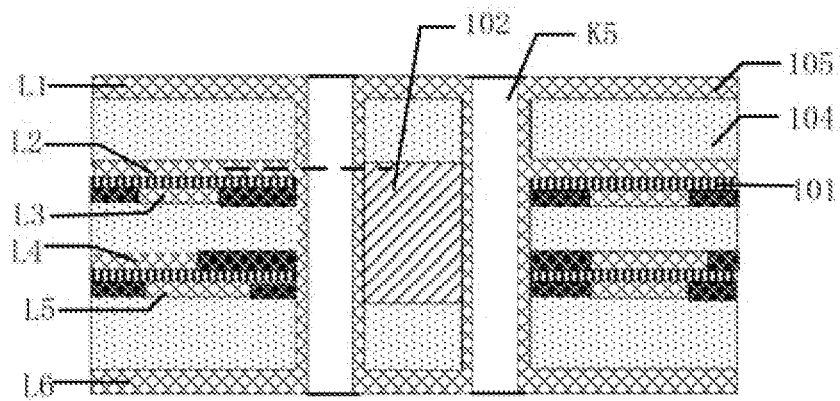
FIG. 7 is a structural schematic diagram of a metal matrix full-buried PCB according to an embodiment of the application.

Reference is made to FIG. 7. In the PCB shown in FIG. 7, the metal matrix 102 is completely enwrapped in the PCB; conductive substances in a conductive hole K5 contact with both the inner geoelectric layer L2 and the metal matrix 102, and also contact with part or all of the wiring layers in addition to the inner geoelectric layer L2, such that the part or all of the wiring layers is in direct interconnection and conduction with the metal matrix 102 via the conductive substances in the hole K5.

Figure 8:
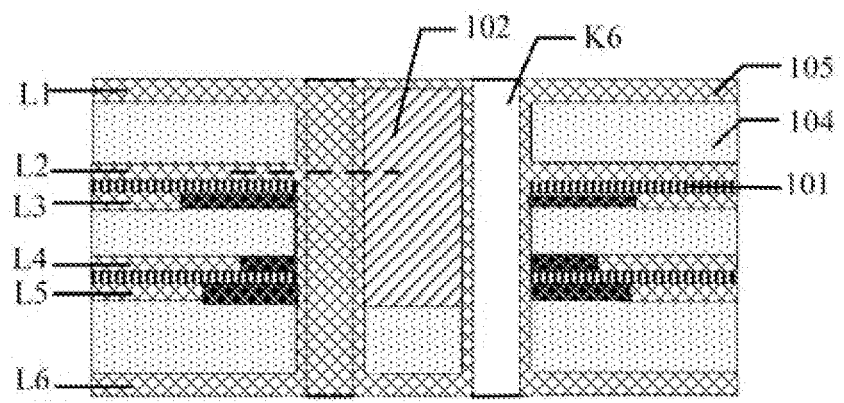
FIG. 8 is a structural schematic diagram of a metal matrix half-buried PCB according to an embodiment of the application.
Figure 9:
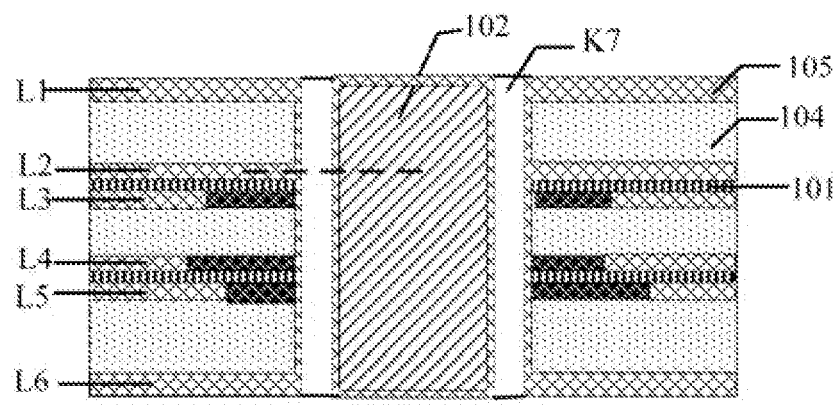
FIG. 9 is a structural schematic diagram of a metal matrix pass-through PCB according to an embodiment of the application.

Reference is made to FIG. 8. In the PCB shown in FIG. 8, the metal matrix 102 is half-buried in the PCB, with the top end of the metal matrix 102 extending through the substrate to be exposed outside of the substrate, and the rest parts of the metal matrix 102 being enwrapped in the substrate. Reference is made to FIG. 9. In the PCB shown in FIG. 9, the metal matrix 102 extends through the PCB, with the top end and the bottom end of the metal matrix 102 passing through the substrate to be exposed outside of the substrate.

Some of the layers L1, L3, L4, L5 and L6 in FIGS. 7 to 9 can be de-metalized, such as to enable the conduction between the wiring layers not de-metallized and the metal matrix via the conductive substances in the conductive hole.

Figure 10:
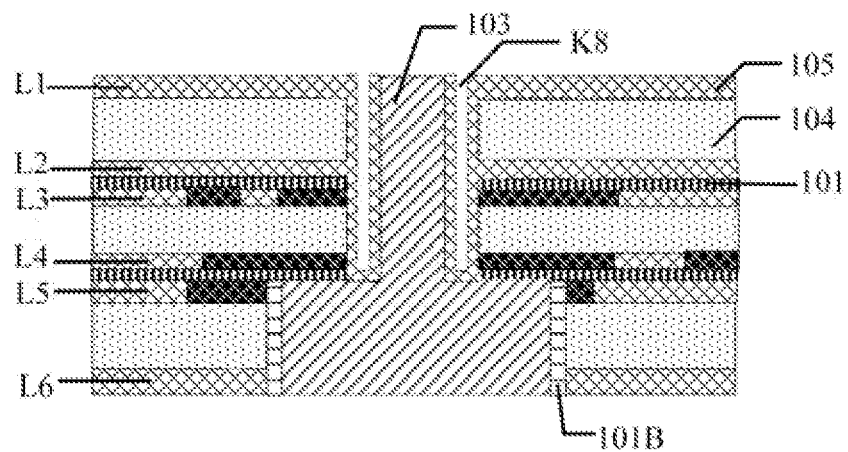
FIG. 10 is a structural schematic diagram of a PCB containing a metal matrix in a "⊟"-shape according to an embodiment of the application.
Figure 11:
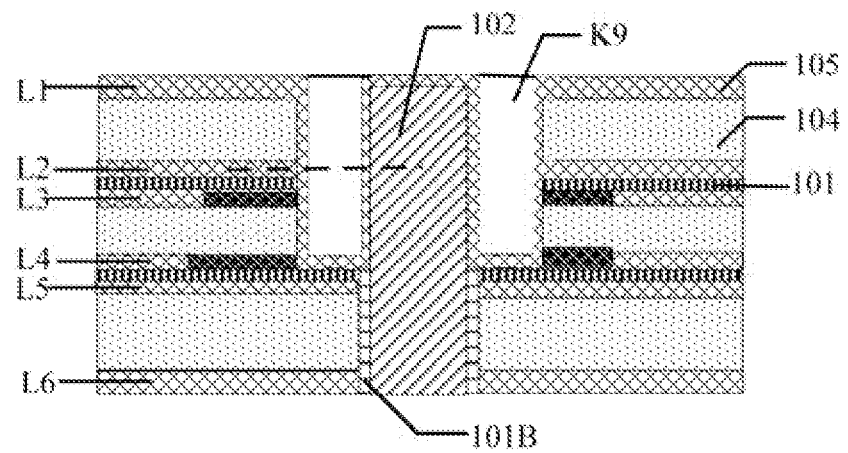
FIG. 11 is a structural schematic diagram of another PCB according to an embodiment of the application.
Figure 12:
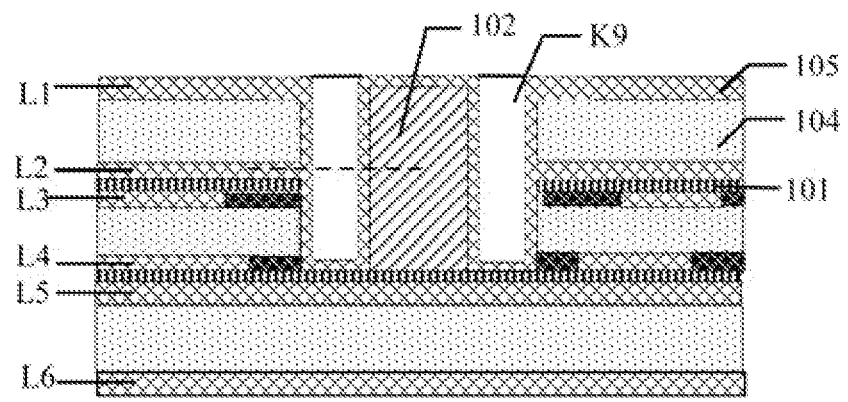
FIG. 12 is a structural schematic diagram of a further PCB according to an embodiment of the application.

It should be understood that, the metal matrix may have various shapes. As shown in FIG. 10, the metal matrix 103 has a shape of "z,21"; the layer L2 on the substrate is the inner geoelectric layer for grounding; and the conductive hole K8 may be a blind hole (of course, it may also be a through hole). It should be understood that, the conductive substances in the hole formed in the PCB can contact with only the metal matrix and part of the wiring layers including the inner geoelectric layer and/or the outer geoelectric layer. FIGS. 11 to 13 exemplarily show a PCB with the pass-through metal matrix, a PCB with the half-buried metal matrix and a PCB with the full-buried metal matrix respectively, in which the formed conductive hole may be a through hole, a blind hole, a buried hole or any combination of various holes, which may be determined in accordance with the actual demand. Meanwhile, wiring layers can be designed and manufactured with corresponding lines, such that the metal matrix 102 can be in conduction with the wiring layers selectively via the conductive substances in the hole.

It should be further noted that, in the embodiments of the application, the conductive hole between the wiring layer and the metal matrix is not limited to the cylindrical hole, and can have any other shape. A conductive slot K10 (which also falls into the concept of the conductive hole) as shown in FIG. 14-*a* can be formed wholly between the metal matrix 102 and the wiring layer. Alternatively, multiple conductive slots K11 as shown in FIG. 14-*b* can be formed and spaced apart between the metal matrix 102 and the wiring layer. Also, as shown in FIG. 15-*a*, not only the conductive hole K4 but also the conductive slot K10 are formed between the metal matrix 102 and the wiring layer. Alternatively, as shown in FIG. 15-*b*, not only the conductive hole K4 but also multiple spaced-apart conductive slots K11 are formed between the metal matrix 102 and the wiring layer. The conductive slots K10 and K11 can be a blind slot, a through slot, or a full-buried slot.

Figure 16:
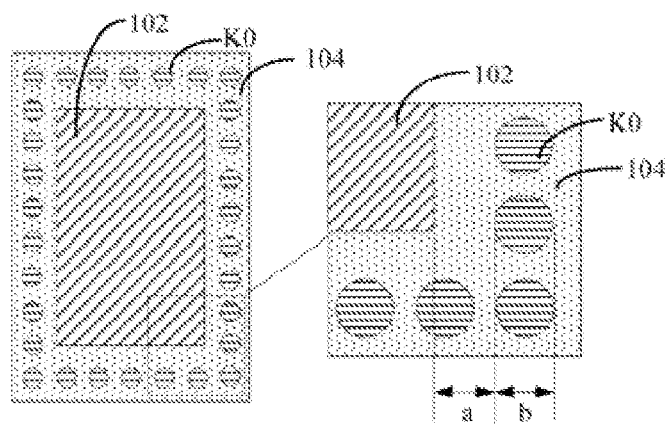
FIG. 16 is an enlarged diagram showing the positional arrangement of a hole in the existing PCB.

Referring to FIG. 16, it is a partial enlarged diagram showing a possible solution of forming a hole in the PCB. Multiple holes K0 are provided around the metal matrix 102, with a certain distance between the holes K0 and the edge of the metal matrix 102. It is assumed that, the size or the metal matrix 102 is M×N; a spacing between the wall of the hole K0 and the metal matrix 102 is a; and the diameter of the hole K0 is b.

Figure 17:
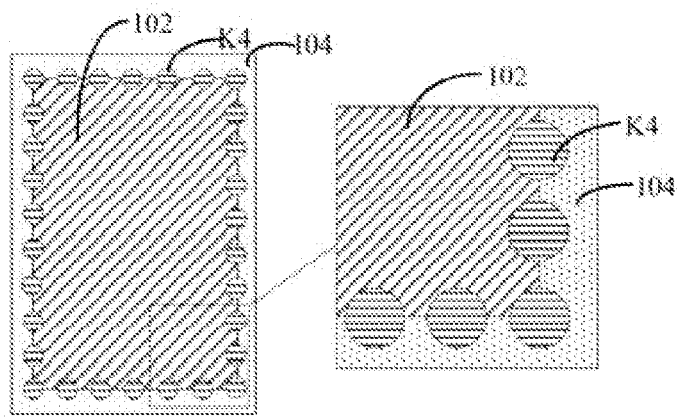
FIG. 17 is an enlarged diagram showing the positional arrangement of a hole in the PCB according to an embodiment of the application.

Referring to FIG. 17, it is a partial enlarged diagram showing holes forming at the edge of the metal matrix of the PCB according to an embodiment of the application. The conductive substances in the hole K4 in FIG. 17 can be in surface-contact with the metal matrix 102.

In the range of a determined substrate, if it is desired not to change the position of the holes in FIG. 16, and to enable the contact between the conductive substances in the holes and the metal matrix 102, the area of the metal matrix 102 needs to be increased. Specifically, the increased area of the metal matrix may be calculated from an equation: $S=(M+N+2a+b)(2a+b)$. Assuming the original size of the metal matrix is 30×40 mm, and a distance between the metal matrix and the wall of holes is 0.4 mm, and the diameter of the holes is 0.4 mm, the increased area of the metal matrix $S=85.44$ mm$^2$ can be obtained from the above equation. The increasing of the area of the metal matrix can improve the effect of heat dissipation, which can provide a wider selection space for the application of high power component. In addition, in the range of a determined substrate, if it is desired not to change the position of the metal matrix in FIG. 16, and to enable contact between the conductive substances in the holes K0 and the metal matrix 102, the shielding ring surrounded by the existing holes K0 is decreased, thus saving the shielding area of the substrate. The saved shielding area can be used for other purposes.

Figure 18:
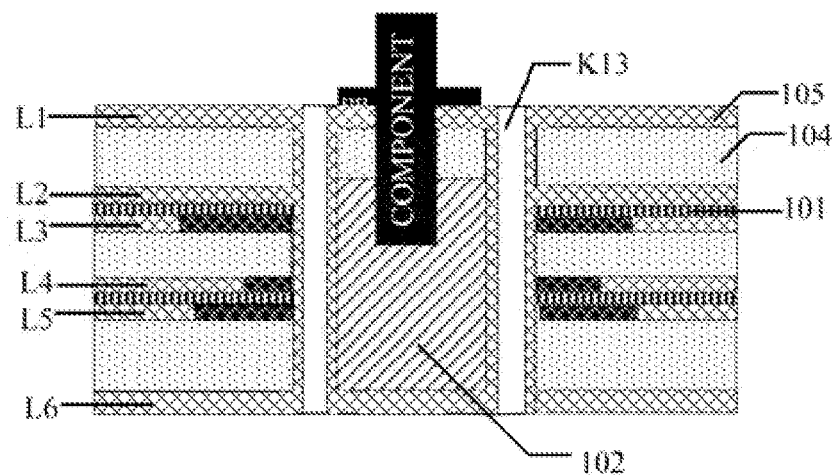
FIG. 18 is a structural schematic diagram of a PCB fixedly provided with a component according to an embodiment of the application.

Furthermore, referring to FIG. 18, in the embodiments of the application, the metal matrix may be provided with a through slot or a blind slot for welding the component therein. In FIG. 18, the conductive substance in an across-boundary hole K13 is not only the medium for the direct conduction between the inner-layer line and the metal matrix, but also is a signal shielding hole for the component. The across-boundary hole K13 has good shielding effect. Meanwhile, with the increasing of the number of the holes K13, the across-boundary holes K13 also increase the heat dissipation area of the metal matrix 102, resulting in the good effect of heat dissipation.

There is also provided an electronic apparatus in the embodiments of the application, including a component and a printed circuit board (PCB).

Specifically, the printed circuit board includes a metal matrix and at least two substrate layers, wherein at least one of the at least two substrate layers has an inner geoelectric layer thereon, the metal matrix is fixed in a slot provided in the substrate; a hole is formed in the printed circuit board, conductive substances in the hole contact with both the inner geoelectric layer and the metal matrix, so that the inner geoelectric layer and the metal matrix are in conduction with each other; wherein a blind slot for installing the component is provided in the printed circuit board, the bottom surface of the blind slot is located partially or wholly on the metal matrix; and wherein the component is installed in the blind slot.

In some embodiments of the application, the hole described above can be a cylindrical hole, a prismatic hole (e.g. a triangular prism hole, a quadrangular prism hole, a hexagonal prism hole, or the like) or an irregular columnar hole (i.e., having a cross section in an irregular shape). The non-cylindrical hole can also be referred to as a slot-hole or a slot. The above metal matrix in the PCB is, for example, a columnar metal matrix or a stepped metal matrix or a metal matrix any other shape. The metal matrix can be buried wholly in the PCB, or can extend through the PCB, or can be half-buried in the PCB.

In some embodiments of the application, the substrate in the PCB can be bonded with the metal matrix, for example, by adhesive, and the substrate layers can also be bonded with each other by adhesive. Both sides of each substrate layer can be provided with a wiring layer. The wiring layer can be classified as a geoelectric layer or a non-geoelectric layer (for ease of description, the wiring layer being a non-geoelectric layer can be referred to as "second wiring layer" below). The adhesive may be, for example, prepreg, conductive adhesive, resin, polyethylene terephthalate plastic or other adhesives. In some embodiments of the application, for example, a second wiring layer(s) may be also provided on the substrate in the PCB. The conductive substances in the above hole can also contact with part or all of the second wiring layers on the substrate.

In some other embodiments of the application, for example, the metal matrix may be directly fixed in a slot provided the substrate. For example, the metal matrix can be frozen firstly (freezing makes the volume of the metal matrix become smaller); then the frozen metal matrix may be placed in the slot provided in the substrate; and once the temperature of the metal matrix rises and thus the volume of the metal matrix becomes larger, the metal matrix can be fixed in the slot. Alternatively, the metal matrix can be forcibly pressed into the slot provided in the substrate. In this case, the above hole may be formed by removing part of the edge of the substrate described above and/or part of the edge of the metal matrix described above.

In some embodiments of the application, the conductive substances in the above hole in the PCB can be, for example, in point-contact, line-contact or surface-contact with the inner geoelectric layer (and/or the second wiring layer), and can be in point-contact, line-contact or surface-contact with the metal matrix. The geoelectric layer in contact with the conductive substances in the hole described above may further include an external wiring layer of the PCB.

In some embodiments of the application, the metal matrix can be full-buried or half-buried in or pass through the PCB described above, and a blind slot for installing a component can be provided in the PCB. The bottom surface of the blind slot is located partially or wholly on the metal matrix. In this way the component (e.g., a power device) installed in the blind slot can also dissipate heat or be grounded via the metal matrix. In some embodiments of the application, the blind slot for installing the component can be partially concaved in the metal matrix (i.e., part of the metal matrix is removed during formation of the blind slot). Of course, the blind slot for installing the component may not be concaved in the to metal matrix (i.e., no part of the metal matrix is removed during formation of the blind slot).

In some embodiments of the application, the above blind slot for installing a component may be metallized, for example, by electroplating, surface coating and so on. After the blind slot is metallized, the component (for example, PA, a power amplifier component or other components) can be installed in the metallized blind slot. Metallization of the blind slot is beneficial in welding and heat dissipation of the component. The metal matrix or the component installed in the blind slot can be in conduction with the inner geoelectric layer or other wiring lavers via the conductive substances on the side wall of the blind slot, and thus become the ground terminal of the component. The component can also be in conduction with the inner geoelectric layer or other wiring layers via the conductive substances on the side wall of the blind slot. In this way, some inner geoelectric layers can also be in direct interconnection and thus conduction with the metal matrix via the conductive substances on the side wall of the blind slot, the grounding performance of the metal matrix and the component is more reliable, thus being beneficial to improve the performance of heat dissipation. Furthermore, since the loop length between the inner geoelectric layer (and/or other wiring layers) and the metal matrix can be reduced, or the grounding loop length between the component and the inner geoelectric layer (and/or other wiring layers) can be reduced, it is beneficial to reduce the generation of the secondary inductance and the parasitic capacitance, thus being beneficial to reduce the influence of the secondary inductance and the parasitic capacitance on transmission of a signal and being beneficial to improve transmission performance of a high frequency signal, and further being beneficial to improve the miniaturization and integration level of the PCB.

It should be understood that, the primed circuit board of the electronic apparatus of the embodiment can have the similar and same structure as the printed circuit board described in the above embodiments, for the description of the relevant structure referring to the above embodiments.

The description of the embodiments focuses on different aspects, and the part which is not described in detail in some embodiments can refer to the relevant description of other embodiments. Meanwhile, the metal matrix in the PCB of the application can be in any shape, dimensional design, selecting-material design, processing design, processing flow deign and adapter design. The arrangement of the metal matrix on the PCB is not limited, which may be half-buried type, pass-through type. full-buried type and so on. The form of the formed hole is not also limited, which may be a through hole, a blind hole and a buried hole and so on. Other PCBs obtained by those skilled in the art without any substantially creative work all fall within the score of protection of the application.

In summary, in the embodiments of the application, since one or more conductive holes are formed between the metal matrix in the PCB and the geoelectric layer on the substrate, with the conductive substances in the conductive hole contacting with both the inner geoelectric layer and the metal matrix of the PCB, the inner geoelectric layer can be in direct interconnection and conduction with the metal matrix via the conductive substances in the hole, so that the grounding performance of the metal matrix is more reliable and it is beneficial to improve the performance of heat dissipation. Furthermore, since the loop length between the inner geoelectric layer and the metal matrix is reduced, it is beneficial to reduce generation of secondary inductance and parasitic capacitance, thus being beneficial to reduce the influence of the secondary inductance and the parasitic capacitance on transmission of a signal, and being beneficial to improve transmission performance of a high frequency signal, and further being beneficial to improve the miniaturization and integration level of the PCB. Furthermore, the conductive hole formed around the metal matrix can have a signal shielding function for the component fixed on the metal matrix, thus being beneficial to further improve the performance of products.

In addition, a blind slot for installing a component can also be provided in the PCB, with the bottom surface of the blind slot being located partially or wholly on the metal matrix. The blind slot can be metallized by electroplating, surface coating and so on. After the blind slot is metallized, the component can be installed in the metallized blind slot. Metallization of the blind slot is beneficial in welding and heat dissipation of the component. The metal matrix or the component installed in the blind slot can be in conduction with the inner geoelectric layer or other wiring layers via the conductive substances on the side wall of the blind slot, and thus become the ground terminal of the component. The component can also be in conduction with the inner geoelectric layer or other wiring layers via the conductive substances on the side wall of the blind slot. In this way, some inner geoelectric layers can also be in direct interconnection and thus conduction with the metal matrix via the conductive substances on the side wall of the blind slot, the grounding performance of the metal matrix and the component is more reliable, thus being beneficial to improve the performance of heat dissipation. Furthermore, since the loop length between the inner geoelectric layer (and/or other wiring layers) and the metal matrix can be reduced, or the grounding loop length between the component and the inner geoelectric layer (and/or other wiring layers) can be reduced, it is beneficial to reduce the generation of the secondary inductance and the parasitic capacitance, thus being beneficial to reduce the influence of the secondary inductance and the parasitic capacitance on transmission of a signal, and being beneficial to improve transmission performance of a high frequency signal, and further being beneficial to improve the miniaturization and integration level of the PCB.

The PCB and the method for processing PCB according to the embodiments of the application are introduced in detail above. The principle and implementation of the application are illustrated by specific examples in the specification. The above description of the embodiments is only to help understand the method of the application and its core idea. Meanwhile, for those skilled in the art, according to the idea of the application, the specific implementation and application range may changes as required. In summary, the content of the specification should not be understood as limitation to the application.

The invention claimed is:

1. A method for processing a printed circuit board, comprising:
   forming a hole in the printed circuit board, wherein the printed circuit board comprises a metal matrix and at least two substrate layers, at least one of the at least two substrate layers has an inner geoelectric layer thereon, and the metal matrix is fixed in a slot provided in the substrate; and
   providing conductive substances in the hole, with the conductive substances in the hole being in contact with the inner geoelectric layer and the metal matrix, so that the inner geoelectric layer and the metal matrix are in conduction with each other.

2. The method according to claim 1, wherein the metal matrix is full-buried or half-buried in the printed circuit board, the method further comprises:
   providing, in the printed circuit board, a blind slot for installing a component, wherein a bottom surface of the blind slot is located partially or wholly on the metal matrix.

3. The method according to claim 2, wherein
   the blind slot is concaved partially in the metal matrix.

4. The method according to claim 2, further comprising:
   metallizing the blind slot.

5. The method according to claim 1, wherein
   forming a hole in a printed circuit board comprises: removing part of edge of the substrate and/or part of edge of the metal matrix to form a hole;
   or,
   in the case where the substrate is bonded with the metal matrix by adhesive, forming a hole in a printed circuit board comprises: removing part of the adhesive between the substrate and the metal matrix to form a hole; or removing part of the edge of the substrate and part of the adhesive between the substrate and the metal matrix to form a hole; or removing part of the edge of the metal matrix and part of the adhesive between the metal matrix and the substrate to form a hole; or removing part of the adhesive between the metal matrix and the substrate and removing part of the edge of the metal matrix and part of the edge of the substrate to form a hole.

6. The method according to claim 1, wherein the substrate is further provided thereon with second wiring layers being non-geoelectric layers, wherein part or all of the second wiring layers on the substrate contact with the conductive substances in the hole, so as to be in conduction with the metal matrix via the conductive substances in the hole.

7. The method according to claim 6, wherein part of the second wiring layers contacting with a wall of the hole contact with the conductive substances in the hole, so as to be in conduction with the metal matrix via the conductive substances in the hole.

8. The method according to claim 1, wherein
forming a hole in a printed circuit board comprises:
forming a hole in the printed circuit board by laser; or
forming a hole in the printed circuit board by a mechanical drill; or
forming a hole in the printed circuit board by plasma etching; or
forming a hole in the printed circuit board by chemical etching.

9. The method according to claim 1, wherein providing conductive substances in the hole comprises: metallizing a wall of the hole; or filling the hole with conductive medium; or welding wires in the hole.

10. The method according to claim 1, wherein
the hole is a blind hole or a through hole or a buried hole, wherein an axis of the hole intersects with or is substantially perpendicular to the geoelectric layer.

11. A printed circuit board, comprising:
a metal matrix and at least two substrate layers;
wherein at least one of the at least two substrate layers has an inner geoelectric layer thereon, the metal matrix is fixed in a slot provided in the substrate, a hole is further formed in the printed circuit board, and conductive substances in the hole are in contact with the inner geoelectric layer and the metal matrix, so that the inner geoelectric layer and the metal matrix are in conduction with each other.

12. The printed circuit board according to claim 11, wherein a blind slot for installing a component is provided in the printed circuit board, wherein a bottom surface of the blind slot is located partially or wholly on the metal matrix.

13. The printed circuit board according to claim 12, wherein
the blind slot is concaved partially in the metal matrix.

14. The printed circuit board according to claim 12, wherein
the blind slot is a metallized blind slot.

15. The printed circuit board according to claim 11, wherein the substrate is further provided thereon with second wiring layers being non-geoelectric layers, wherein part or all of the second wiring layers on the substrate contact with the conductive substances in the hole, so as to be in conduction with the metal matrix via the conductive substances in the hole.

16. The printed circuit board according to claim 11, wherein
the hole is a blind hole or a through hole or a buried hole, wherein an axis of the hole intersects with or is substantially perpendicular to the geoelectric layer.

17. The printed circuit board according to claim 11, wherein the metal matrix is a columnar metal matrix or a stepped metal matrix.

18. An electronic apparatus, comprising a component and a printed circuit board,
wherein the printed circuit board comprises:
a metal matrix and at least two substrate layers;
wherein at least one of the at least two substrate layers has an inner geoelectric layer thereon, the metal matrix is fixed in a slot provided in the substrate, a hole is formed in the printed circuit board, and conductive substances in the hole are in contact with the inner geoelectric layer and the metal matrix, so that the inner geoelectric layer and the metal matrix are in conduction with each other.

19. The electronic apparatus according to claim 18, wherein a blind slot for installing a component is provided in the printed circuit board, and wherein a bottom surface of the blind slot is located partially or wholly on the metal matrix; and wherein the component is installed in the blind slot.

20. The electronic apparatus according to claim 19, wherein the blind slot is a metallized blind slot.

* * * * *